(12) United States Patent
Yamazaki

(10) Patent No.: US 7,539,370 B2
(45) Date of Patent: May 26, 2009

(54) MOUNTING STRUCTURE OF SEMICONDUCTOR OPTICAL ELEMENT

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/145,064

(22) Filed: Jun. 24, 2008

(65) Prior Publication Data

US 2009/0010592 A1    Jan. 8, 2009

(30) Foreign Application Priority Data

Jul. 5, 2007   (JP)   ............................. 2007-177139

(51) Int. Cl.
*G02B 6/12* (2006.01)
*G02B 6/30* (2006.01)
*G02B 6/36* (2006.01)

(52) U.S. Cl. ............................. 385/14; 385/49; 385/50; 385/91

(58) Field of Classification Search ................... 385/14, 385/39, 49, 50, 52, 88–94
See application file for complete search history.

(56) References Cited

U.S. PATENT DOCUMENTS

| 4,611,884 A * | 9/1986 | Roberts | ........................ 385/44 |
| 2004/0208458 A1* | 10/2004 | Uno et al. | ...................... 385/89 |

FOREIGN PATENT DOCUMENTS

JP    2001272582 A    10/2001

* cited by examiner

*Primary Examiner*—Sung H Pak
*Assistant Examiner*—Daniel Petkovsek

(57) ABSTRACT

To provide a mounting structure of a semiconductor optical element, in which structure the turning of a refractive index matching gel is prevented. There is provided a mounting structure of a light emitting element, in which structure signal light emitted from one end of an SOA 2 with phase control mounted to a PLC platform 1 with an optical waveguide 1*a* formed therein is made incident on the optical waveguide 1*a* and is then again made incident on the SOA 2 with phase control to be emitted from the other end of the SOA 2, wherein the SOA 2 with phase control is mounted to the PLC platform 1 in a state where the other end of the SOA 2 with phase control is projected from the PLC platform 1, and wherein a refractive index matching gel 3 is arranged between the one end of the SOA 2 with phase control and the optical waveguide 1*a*.

9 Claims, 5 Drawing Sheets

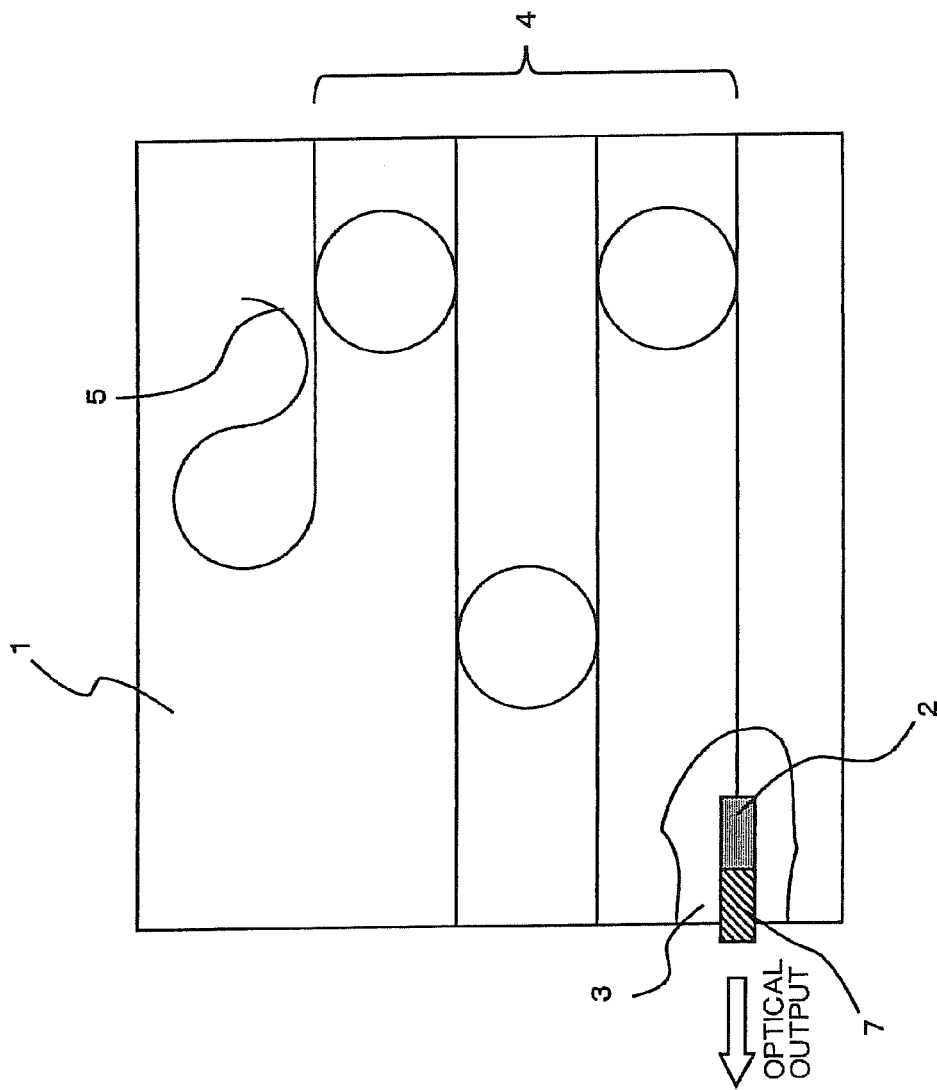

MOUNTING STRUCTURE OF SEMICONDUCTOR OPTICAL ELEMENT

This application is based upon and claims the benefit of priority from Japanese paten application No. 2007-177139, filed on Jul. 5, 2007, the disclosure of which is incorporated herein in its entirety by reference.

BACKGROUND OF THE INVENTION

1. Field of the Present Invention

The present invention relates to a mounting structure of a semiconductor optical element, and more particularly to a mounting structure of a semiconductor optical element configured to take out an optical output from an opposite side to a PLC (Planar Lightwave Circuit).

2. Description of Related Art

With the advent of the broadband era, various optical devices are used in the optical transmission system. In the trunk system, the introduction of the WDM (Wavelength Division Multiplexing) transmission system has been increasing.

In recent years, the use of the DWDM apparatus (dense wavelength division multiplexing apparatus), which enables higher speed transmission by multiplexing tens of optical wavelengths, has also been spread. In each WDM transmission system, a light source is required for each optical wavelength, and hence the number of necessary light sources is remarkably increased in correspondence with the higher multiplexing.

Further, in recent years, the ROADM (Reconfigurable Optical Add/Drop Multiplexers) configured to add or drop an arbitrary wavelength at each node has been studied in order to be commercialized.

In the optical access system, various module structures have been proposed in order to realize a lower cost optical module. The structures used in the optical access system are roughly classified into two types.

The one is a structure in which full duplex communication is realized in such a way that a beam splitter is introduced in a module and that different wavelengths are used for the incoming and outgoing transmission. In this structure, the beam splitter in which a wavelength filter is introduced, a semiconductor laser, and a light receiving element are introduced in the module. However, in this structure, because of the complicated module structure and the need for strict alignment accuracy, it is considered to be difficult to satisfy the demand of low cost.

As the other structure, in order to provide an optical module at low cost, there is proposed a structure in which a semiconductor laser and a light receiving element are mounted on a platform with a quartz waveguide formed therein.

FIG. 1 shows an example of the structure of the latter optical module. A branching waveguide is formed by a PLC. An optical fiber 14 is mounted, without being adjusted, on a PLC platform 11 by using a V-groove. By this method, the optical fiber core and the waveguide 11a can be positioned at a micrometer level. Further, a semiconductor laser 12 and the optical fiber 14 can be coupled to the waveguide at a sub-micrometer level, without the need of optical axis alignment, in such a way that a mark pattern formed on the semiconductor laser 12 and a mark pattern formed on the PLC platform 11 are matched with each other by using infrared transmitted light.

In the optical module configured in this way, all the work of optical axis alignment can be automated. This greatly contributes to reducing the production cost of the optical module.

The optical module is configured such that an optical filter 15 is arranged at a returning portion of the waveguide 11a, and that only light of a specific wavelength is returned at the returning portion and light of the other wavelengths is received by a PD 16 supported by a PD carrier 17.

As a device in which the passive alignment is used, there is a wavelength tunable laser as shown in FIG. 2. This device is regarded as a key device of the WDM transmission system and is energetically studied in many research institutes. In the structure shown in FIG. 2, three stages of ring resonators 24 are connected in series on a PLC platform 21, and the waveguide is configured to be turned back by a waveguide mirror 25.

A wavelength tunable operation is realized by performing phase control in such a way that the refractive index is locally changed by energizing a heater formed in the each ring resonator. One of the ring resonators is adjusted to match a predetermined period (for example, a period of ITU grid), so that a highly precise wavelength locking operation is realized. An SOA (Semiconductor Optical Amplifier) 22 with phase control, which is a type of the semiconductor optical element, is mounted on the PLC platform 21 with high precision by the passive alignment.

As advantages of this structure, there are listed highly reliable operation based on a structure with no movable portion, production cost reduction based on a simple structure realized by integrating functions as a wavelength tunable laser into one chip, and the like.

Usually, when a semiconductor optical element is mounted by the passive alignment, Fresnel reflection is caused at a connection position because of a difference in the refractive index between the waveguide and the semiconductor optical element. In order to prevent the reflection, there is used a refractive index matching gel with a refractive index close to the refractive index of the waveguide of the PLC platform. In the example shown in FIG. 2, even when a non-reflection coating is not applied to the waveguide, it is possible to realize a stable operation with little ripple in such a way that the non-reflection coating is not applied to air but is applied to the refractive index matching gel 23 to thereby prevent the reflection.

In Japanese Patent Laid Open Publication No. 2001-272582, there is disclosed an invention in which a structure configured to make the end of an adhesive layer recede to the inside from a light emitting surface is adopted, and in which it is thereby prevented that the end of the adhesive layer is extended to be raised to the emitting surface side and projects in the optical path so as to shield the emitted light.

SUMMARY

The viscosity of the refractive index matching gel is generally low. Thus, even when the refractive index matching gel is applied to only the vicinity of the connection point between the waveguide and the SOA with phase control, the gel is spread over a wide area. Therefore, in the case where the refractive index matching gel is used, even when the end of the coating area is set to the inside of the light emitting surface as in the invention disclosed in Japanese Patent Laid Open Publication No. 2001-272582, a part of the gel may be turned to reach the light emitting surface, so as to thereby prevent the light emission. That is, a part of gels may also be turned to reach the light emitting section of the SOA with phase control. In this case, there is a possibility that the front surface reflectance is made lower than a design value, or that the efficiency of coupling with the optical fiber is lowered by deformation of the light emitting surface.

In this way, the turning of the refractive index matching gel causes a characteristic change and causes to lower the yield. In the case where light is directly taken from the semiconductor optical element mounted by the passive alignment as in the above described wavelength tunable laser, it is important in particular to avoid the turning of the refractive index matching gel.

The present invention has been made in view of the above described problem. An exemplary object of the present invention is to provide a mounting structure of a semiconductor optical element, in which structure the turning of the refractive index matching gel is prevented.

To this end, according to the present invention, there is provided a mounting structure of a semiconductor optical element, in which structure signal light emitted from one end of the semiconductor optical element mounted to a platform with an optical waveguide formed therein is made incident on the optical waveguide and is then again made incident on the semiconductor optical element to be emitted from the other end of the semiconductor optical element, wherein the semiconductor optical element is mounted to the platform in a state where the other end is projected from the platform, and wherein a refractive index matching gel is arranged between the one end of the semiconductor optical element and the optical waveguide.

BRIEF DESCRIPTION OF THE DRAWINGS

FIG. 5 is a view showing a configuration of a semiconductor laser according to a second exemplary embodiment in which the present invention is preferably implemented.

EXEMPLARY EMBODIMENT

First Exemplary Embodiment

There will be described a first exemplary embodiment in which the present invention is preferably implemented.

Figure 1:
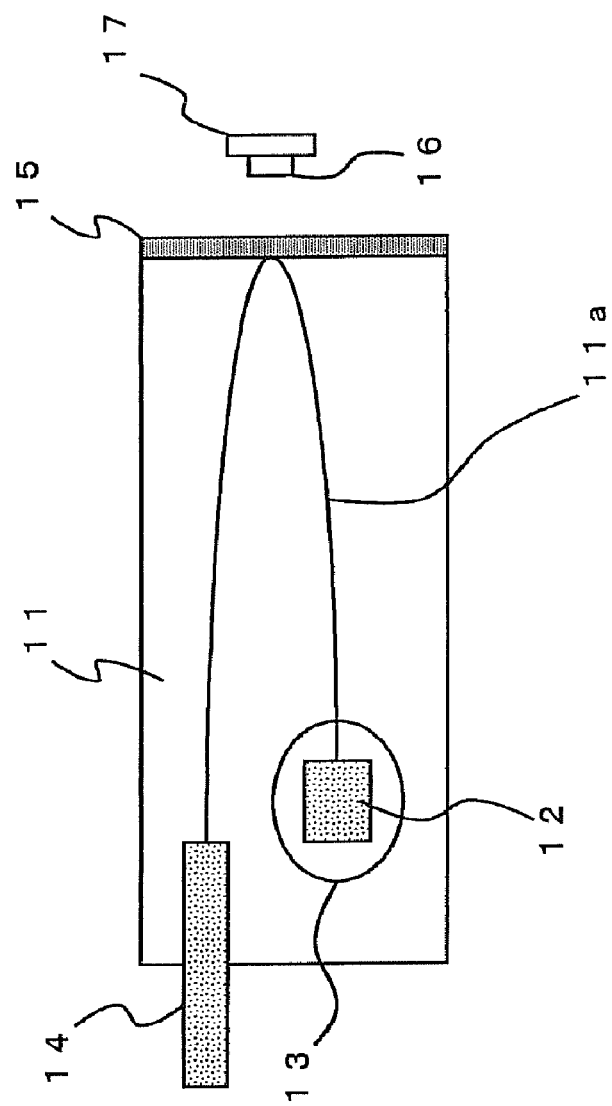
FIG. 1 is a view showing a configuration of a common optical module.
Figure 2:
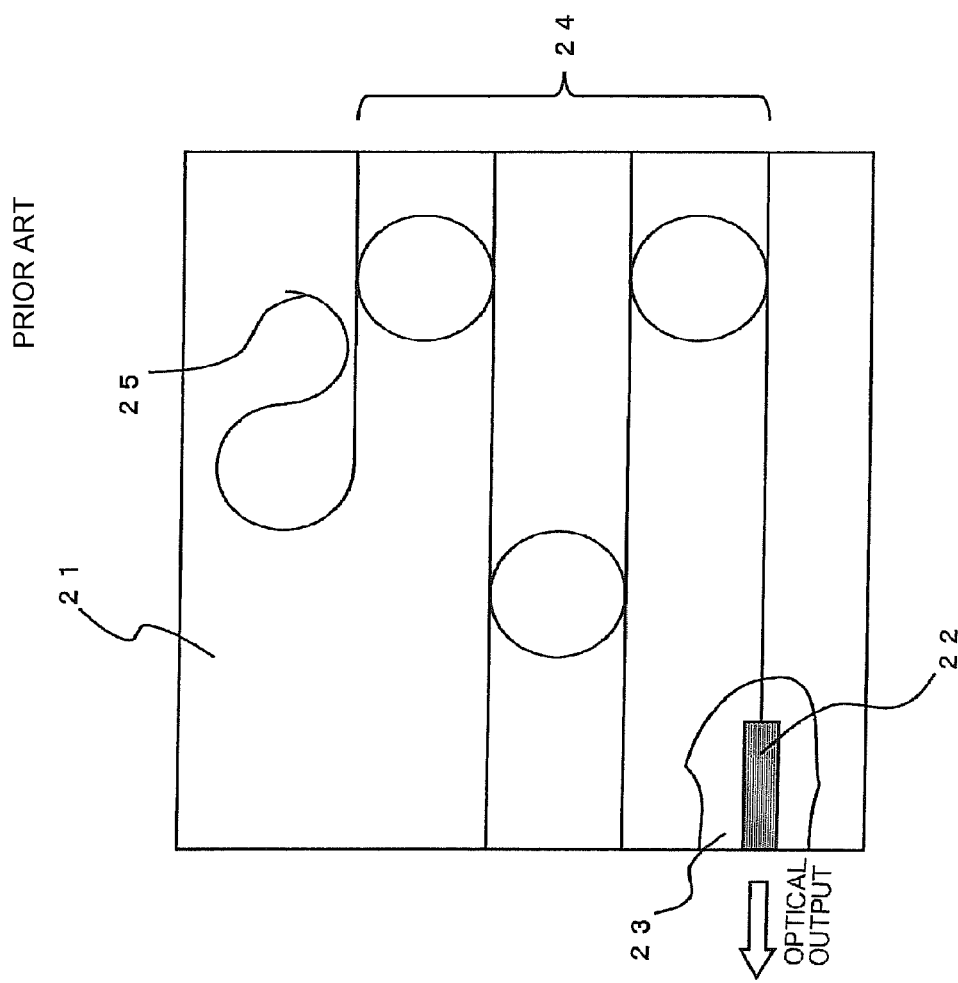
FIG. 2 is a view showing a configuration of a wavelength tunable laser in which ring resonance circuits are used.
Figure 3:
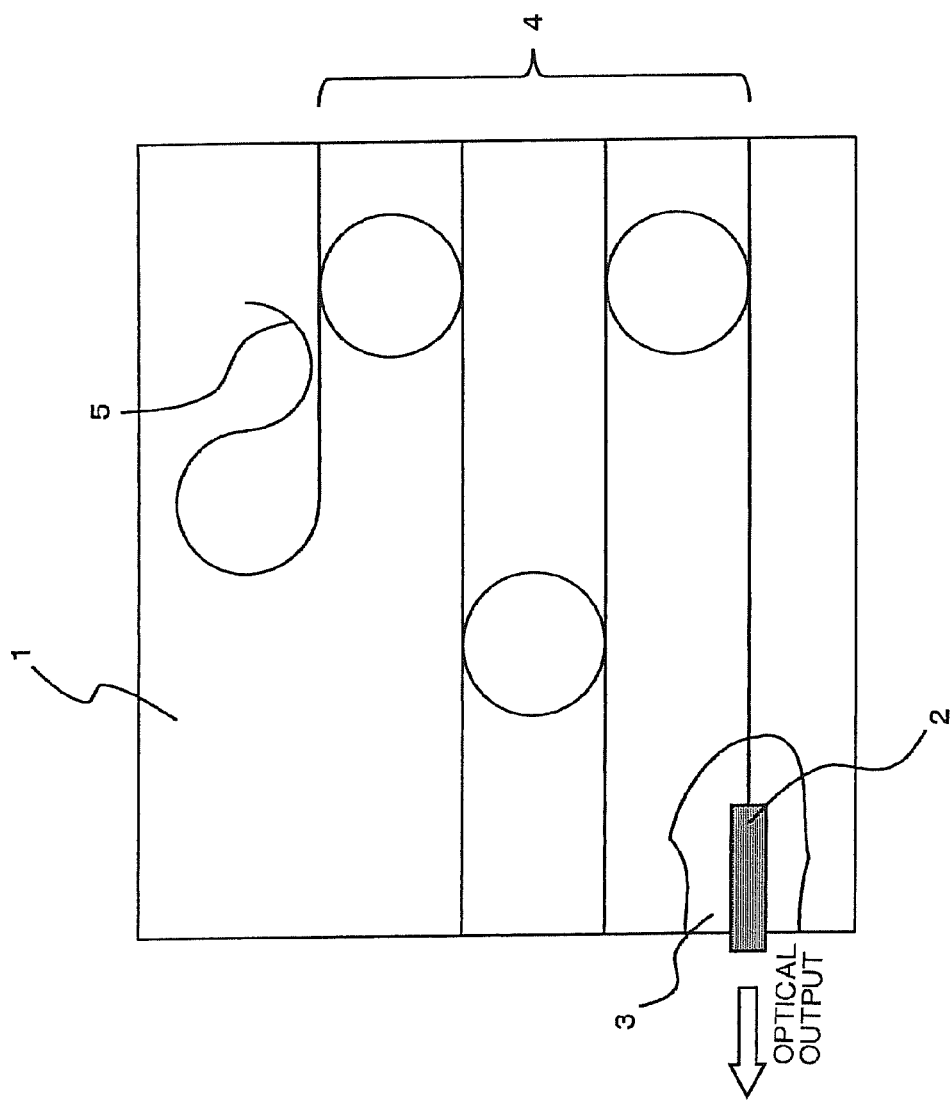
FIG. 3 is a view showing a configuration of a semiconductor laser according to a first exemplary embodiment in which the present invention is preferably implemented.
Figure 4:
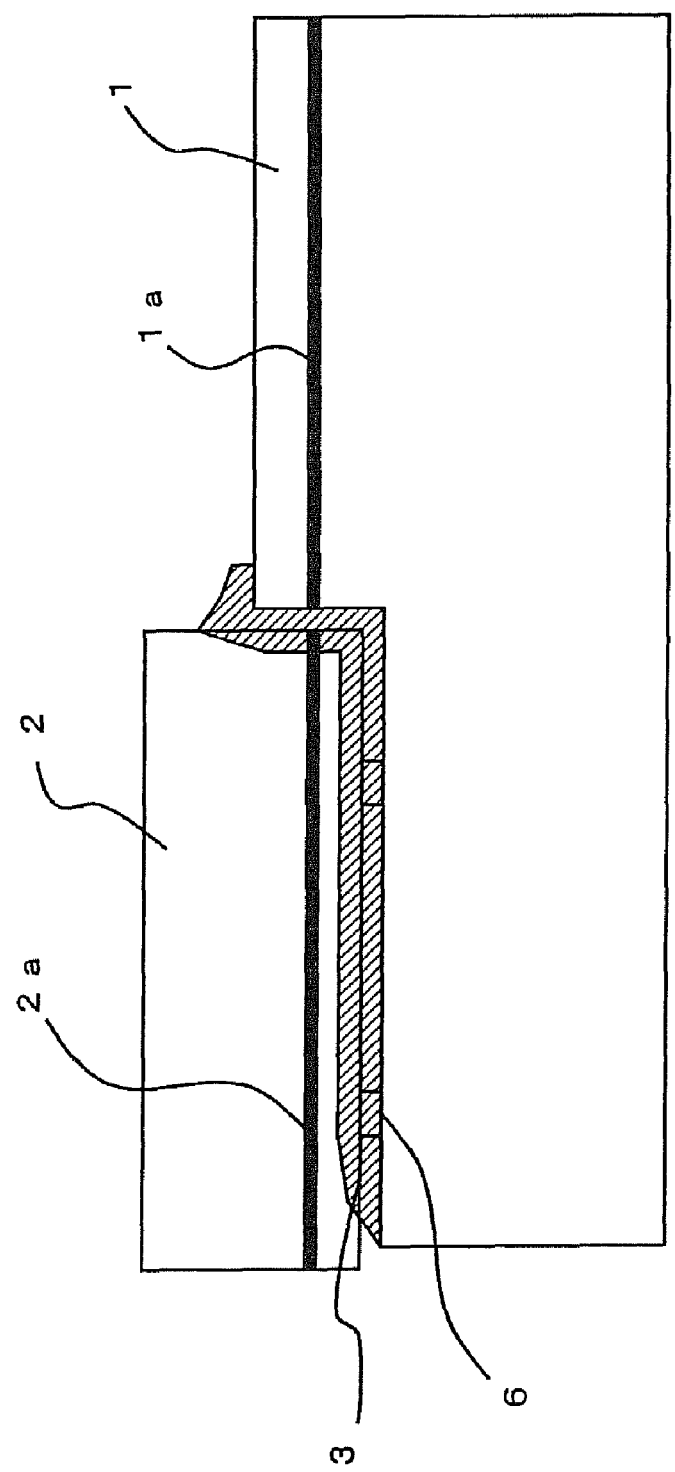
FIG. 4 is a view showing a configuration of the semiconductor laser according to the first exemplary embodiment.

FIG. 3 and FIG. 4 show a mounting structure of a semiconductor optical element according to the present embodiment. An SOA 2 with phase control is mounted on a PLC platform 1 by the passive alignment. The passive alignment technique is a technique in which the positioning is performed by using a mark pattern formed on the PLC substrate surface and a mark pattern of an LD chip, and which eliminates the need of optical axis alignment previously performed in manufacturing an optical module and greatly improves the cost and the lead time for producing the module.

In order to match the height of a waveguide 11a formed in the PLC platform 1 with the height of a waveguide 2a formed in the SOA 2 with phase control, pedestals 6 are arranged between the SOA 2 with phase control and the PLC platform 1.

In the waveguide 1a coupled to the SOA 2 with phase control, three stages of ring resonators 4 are formed. Further, the waveguide 1a is configured to be turned back by a waveguide mirror 5, so that a wavelength tunable operation is performed.

The end surface of the SOA 2 with phase control mounted by the passive alignment is projected from the end surface of the PLC platform 1. With this configuration, even when a refractive index matching gel 3 with low viscosity is used, it is possible to prevent the refractive index matching gel 3 from being turned to reach the light emitting end surface, and thereby possible to prevent change in the oscillation characteristics and deterioration in the coupling characteristics with the fiber.

With the configuration in which the end surface of the light taking-out element (SOA 2 with phase control) is projected from the PLC platform 1 in this way, it is possible to prevent the refractive index matching gel 3 from being turned to reach the end surface of the element. Thereby, it is possible to stabilize the oscillation characteristics and to realize excellent coupling characteristics with the fiber with high yield.

Second Exemplary Embodiment

There will be described a second exemplary embodiment in which present invention is preferably implemented.

FIG. 5 shows a configuration of a modulator integrated wavelength tunable laser in the case where a modulator 7 is mounted as another chip by the passive alignment in addition to the SOA 2 with phase control. The configuration of the second exemplary embodiment is almost the same as that of the first exemplary embodiment, but is different in that the modulator 7 is further provided.

In this configuration, the oscillation characteristics can be more stabilized as the reflectance of the emitting end of the modulator 7 is reduced. For this reason, when the refractive index matching gel 3 is brought into contact with the emitting end surface of the modulator 7, the reflectance of the emitting end of the modulator is increased, so that the oscillating operation of the wavelength tunable laser is made unstable. In addition, the coupling characteristics with the fiber may be deteriorated by the deformation of the emitting end surface.

In order to prevent such faults, it is configured such that the end surface of the light taking-out modulator 7 is projected from the PLC platform 1. This prevents the refractive index matching gel 3 from being brought into contact with the emitting end surface of the modulator 7, so that the stable operation and the excellent coupling characteristics with the fiber can be realized.

In this way, with the configuration in which the end surface of the light taking-out element (modulator 7) is projected from the PLC platform 1, it is possible to prevent the refractive index matching gel 3 from being turned to reach the end surface of the light taking-out element. Thereby, it is possible to stabilize the oscillation characteristics and to realize excellent coupling characteristics with the fiber with high yield.

Note that the above described embodiments are examples in which the present invention is preferably implemented, but the present invention is not limited to these.

For example, the each embodiment as described above is configured such that the wavelength tunable operation is performed by using the three stages of ring resonators, but the number of stages of ring resonators can be arbitrarily set. Further, as long as the wavelength tunable operation can be performed, the ring resonator need not be necessarily used.

Further, the each embodiment as described above is configured such that the SOA with phase control is used as an example of a semiconductor optical element. However, it is needless to say that the present invention can be applied to all semiconductor optical elements including a semiconductor laser.

In this way, various modifications are possible within the scope and spirit of the present invention.

What is claimed is:

1. A semiconductor optical device comprising:
   a platform having a cross-section in which the platform is missing an exterior corner, the platform having an upper horizontal surface, a lower horizontal surface, and a middle horizontal surface between the upper and the lower horizontal surfaces, the platform having a left vertical surface, a right vertical surface, and a middle vertical surface between the left and the right vertical surfaces, the middle horizontal surface meeting the middle vertical surface to define an interior corner corresponding to the exterior corner missing in the platform;
   a mounting structure on the middle horizontal surface of the platform;
   an emitting semiconductor optical element attached to the mounting structure, the optical element attached to the mounting structure in such a way that a left side of the optical element protrudes from the left vertical surface of the platform, an upper side of the optical element protrudes from the upper horizontal surface of the platform, a first gap is defined between a bottom side of the optical element and the middle horizontal surface of the platform, and a second gap is defined between a right side of the optical element and the middle vertical surface of the platform; and,
   a refractive index matching gel disposed at least within the first and the second gaps in such a way that at least the left side of the optical element remains at least substantially uncovered by the gel.

2. The semiconductor optical device of claim 1, further comprising a first optical waveguide disposed within the platform and extending from the right vertical surface of the platform to the middle vertical surface of the platform.

3. The semiconductor optical device of claim 2, further comprising a second optical waveguide disposed within the optical element and extending from the left side of the optical element to the right side of the optical element.

4. The semiconductor optical device of claim 3, wherein the first and the second optical waveguides are at least substantially collinear with one another.

5. The semiconductor optical device of claim 1, further comprising a wavelength tunable circuit formed in the platform by an optical waveguide of the platform.

6. The semiconductor optical device of claim 5, wherein the wavelength tunable circuit comprises at least one stage of a ring resonator.

7. The semiconductor optical device of claim 1, wherein a refractive index of the gel is closer in value to a refractive index of an optical waveguide of the platform than to a refractive index of the optical element.

8. The semiconductor optical device of claim 1, wherein the semiconductor optical element comprises a semiconductor optical amplifier having phase control.

9. The semiconductor optical device of claim 1, wherein the semiconductor optical element comprises a semiconductor optical amplifier having phase control disposed towards the right side and a modulator disposed towards the left side.

* * * * *